US009136849B2

(12) United States Patent
Tseng

(10) Patent No.: US 9,136,849 B2
(45) Date of Patent: Sep. 15, 2015

(54) INTEGER FREQUENCY DIVIDER AND PROGRAMMABLE FREQUENCY DIVIDER CAPABLE OF ACHIEVING 50% DUTY CYCLE

(71) Applicant: MStar Semiconductor, Inc., Hsinchu Hsien (TW)

(72) Inventor: Sheng-Che Tseng, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/324,339

(22) Filed: Jul. 7, 2014

(65) Prior Publication Data

US 2015/0015312 A1    Jan. 15, 2015

(30) Foreign Application Priority Data

Jul. 12, 2013    (TW) .............................. 102125094 A

(51) Int. Cl.
*H03K 21/10*    (2006.01)
*H03K 21/02*    (2006.01)

(52) U.S. Cl.
CPC .............. *H03K 21/10* (2013.01); *H03K 21/023* (2013.01)

(58) Field of Classification Search
CPC .... H03K 21/00; H03K 23/544; H03K 23/667
USPC ........................................................ 327/115
See application file for complete search history.

(56) References Cited

U.S. PATENT DOCUMENTS

| 6,123,796 | A | 9/2000 | Kathmann et al. | |
| 7,035,368 | B2* | 4/2006 | Pickering et al. | 375/376 |
| 8,049,546 | B2* | 11/2011 | Oh | 327/219 |
| 8,058,901 | B2* | 11/2011 | Zhang et al. | 326/46 |
| 2004/0160247 | A1* | 8/2004 | Magoon et al. | 327/115 |

FOREIGN PATENT DOCUMENTS

TW         200816639 A    4/2008

* cited by examiner

*Primary Examiner* — Sibin Chen
*Assistant Examiner* — Metasebia Retebo
(74) *Attorney, Agent, or Firm* — Edell, Shapiro & Finnan, LLC

(57) ABSTRACT

An integer frequency divider capable of achieving a 50% duty cycle includes a source clock input end that provides a source clock, and two or more latches connected in series according to a connection order. Each of the latches includes: a signal input stage, configured to receive an input signal; a clock receiving stage, configured to treat the source clock as an input clock and an inverted clock of the source clock as an inverted signal of the input clock when the latch corresponds to an odd number in the connection order, and to treat the inverted clock as the input clock and the source clock as the inverted signal of the input clock when the latch corresponds to an even number in the connection order; and a signal output stage, configured to output an output signal according to the input signal and the source clock.

13 Claims, 8 Drawing Sheets

INTEGER FREQUENCY DIVIDER AND PROGRAMMABLE FREQUENCY DIVIDER CAPABLE OF ACHIEVING 50% DUTY CYCLE

This application claims the benefit of Taiwan application Serial No. 102125094, filed Jul. 12, 2013, the subject matter of which is incorporated herein by reference.

BACKGROUND OF THE INVENTION

1. Field of the Invention

The invention relates in general to an integer frequency divider and a programmable integer frequency divider, and more particularly to an integer frequency divider and a programmable integer frequency divider capable of achieving a 50% duty cycle.

2. Description of the Related Art

In a common electronic circuit, different elements need to refer to a reference signal to perform individual or synchronous operations. The reference clock is usually generated by a frequency synthesizer according to a source clock. A frequency synthesizer usually includes a single-modulus or multi-modulus integer frequency divider. The integer frequency divider generates a low-frequency output signal according to a high-frequency input signal to provide an integer or fractional frequency dividing effect for subsequent uses. The fractional frequency dividing may be realized through a triangle integrator that controls an integer frequency divider operable with multiple divisors.

Implementation of the foregoing integer frequency divider may be achieved by a latch or multiple latches connected in series. The latch/latches generate(s) an output clock having a frequency that is (1/K) of an input clock, where K is a frequency divisor of the integer frequency divider. To ensure that the output clock provides sufficient and equal high-level and low-level periods for later uses, an ideal duty cycle of the output clock is 50%. However, when K is a non-integral multiple of 2 (e.g., when K is equal to 3), in order to generate an output signal having a 50% duty cycle, the integer frequency divider requires an additional control/trimming circuit or the latch/latches require(s) an additional control signal θ. The additional control/trimming circuit or control signal θ consumes more costs, limits the operation speed of the overall circuit, and/or increases control complications. Further, a latch suitable for an even divisor is not suitable in operations of a latch for an odd divisor. As a result, a programmable integer frequency divider implemented by latches cannot at the same time support odd-number and even-number frequency dividing operations, thus posing substantial limitations on the application of the programmable integer frequency divider. Prior art of the technical field may be referred from Taiwan Patent Publication 200816639; U.S. Pat. No. 6,123,796; and following periodicals: Rahul Magoon et al., "A Single-Chip Quad-Band (950/1000/1900/11000 MHz) Direct Conversion GSM/GPRS RF Transceiver with Integrated VCOs and Fractional-N Synthesizer," in *IEEE JOURNAL OF SOLID-STATE CIRCUITS, VOL. 37, NO. 12, DECEMBER 2002*; Sheng-Che Tseng et al., "True 50% Duty-Cycle SSH and SHH SiGe BiCMOS Divide-by-3 Prescalers," in *IEICE TRANS. ELECTRON., VOL. E-89-C, NO. 6 Jun. 2006*.

SUMMARY OF THE INVENTION

The invention is directed to an integer frequency divider and a programmable frequency divider capable of achieving a 50% duty cycle.

An integer frequency divider capable of achieving a 50% duty cycle is disclosed by the present invention. According to an embodiment, the integer frequency divider includes a clock input end that provides a clock, and N latches connected in series according to a connection order, where N is a positive integer greater than 2. Each of the latches includes: a signal input stage, configured to receive an input signal; a clock receiving stage, configured to treat the clock as an input clock and an inverted clock of the clock as an inverted signal of the input clock when the latch corresponds to an odd number in the connection order, and to treat the inverted clock as the input clock and the clock as the inverted signal of the input clock when the latch corresponds to an even number in the connection order; and a signal output stage, configured to output an output signal according to the input signal and the clock.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 1b is a schematic diagram of an example of the integer frequency divider in FIG. 1a;

FIG. 4b is an equivalent circuit diagram of FIG. 4a;

FIG. 5b is an equivalent circuit diagram of FIG. 5a;

FIG. 9b is an equivalent circuit diagram of FIG. 9a; and

DETAILED DESCRIPTION OF THE INVENTION

Technical terms of the application are based on general definition in the technical field of the application. If the application describes or explains one or some terms, definitions of the terms are based on the description or explanation of the application.

The disclosure of the application includes an integer frequency divider and a programmable integer frequency divider for providing an output signal having a 50% duty cycle. In possible implementation, based on the disclosure of the application and his/her own need, one skilled person in the art can realize the application by choosing equivalent elements or steps, and can selectively implement part or all technical features of any embodiment of the application or selectively combine part or all technical features of the embodiments of the application. Further, part of elements included in the integer frequency divider and the programmable integer frequency divider may be individually known elements. Without affecting the full disclosure and possible implementation of the application, details of the known elements are omitted.

Figure 1A:
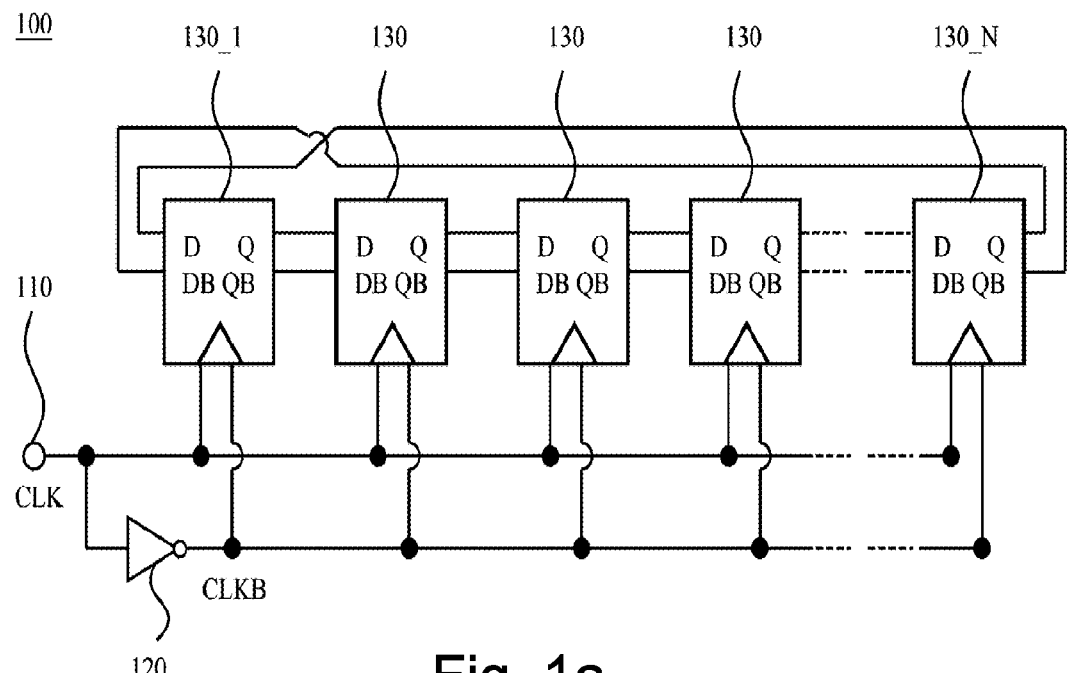
FIG. 1a is a schematic diagram of an integer frequency divider according to an embodiment of the present invention.

FIG. 1a shows a schematic diagram of an integer frequency divider according to an embodiment of the present invention. As shown, an integer frequency divider 100 according to the embodiment includes a source clock input end 100 that provides a source clock (CLK), at least one inverter 120 that generates an inverted source clock (CLKB) according to the source clock, and N latches 130 (where N is a positive integer greater than or equal to 2). It should be noted that, when the source clock is a differential signal, the differential signal may concurrently provide a source clock and an inverted source clock, meaning that an inverter for generating the inverted source clock is no longer needed. In the embodiment, for example, the latches 130 may also be Flip-flops 130. The N latches 130_1 to 130_N are connected in series according to a connection order. Each of the latches 130_1 to 130_N includes a signal input stage, a clock receiving stage, and a signal output stage. The signal input stage receives an input signal (D), and an inverted signal (DB) of the input signal. The clock receiving stage receives the source clock and the inverted source clock. When the latch 130 corresponds to an odd number in the connection order, the clock receiving stage treats the source clock as an input clock and treats the inverted source clock as an inverted signal of the input clock. When the latch 130 corresponds to an even number in the connection sequence, the clock receiving stage treats the inverted source clock as the input clock, and treats the source clock as an inverted signal of the input clock. The odd number and even number in the connection order are defined based on a start point and an end point of the connection order by a person skilled in the art. The signal output stage outputs an output signal (Q) and an inverted signal (QB) of the output signal according to the input signal and the source clock. When N is an odd number, operations of the latch 130 at least correspond to a first mode, as represented Table-1 below, where "0" represents a first level and "1" represents a second level. It should be noted that, for any of the latches 130, when definitions of the source clock and the inverted source clock are exchanged, the corresponding relationship of signals in the first mode in Table-1 is replaced by that in Table-2. Further, Table-1 and Table-2 may be jointly represented by Table-3. Further, details of integrating the inverter 120 into the latches 130 are a generally known common sense in the technical field, and one person skilled in the art would correspondingly adjust the circuit corresponding relationship based on the disclosure of the application. Without affecting the full disclosure and implementation of the application, non-necessary details are omitted herein.

TABLE 1

| Input signal D | Source clock CLK | Output signal Q |
| --- | --- | --- |
| 0 | 0 | 0 |
| 0 | 1 | Unchanged |
| 1 | 0 | Unchanged |
| 1 | 1 | 1 |

TABLE 2

| Input signal D | Source clock CLK | Output signal Q |
| --- | --- | --- |
| 0 | 0 | Unchanged |
| 0 | 1 | 0 |
| 1 | 0 | 1 |
| 1 | 1 | Unchanged |

TABLE 3

| Input signal D | Source clock CLK | Output signal Q |
| --- | --- | --- |
| 0 | 0 | 0 |
| 0 | 1 | Unchanged |
| 1 | 0 | Unchanged |
| 1 | 1 | 1 |

Referring to FIG. 1a, to form a frequency dividing loop, the latches 130 include a first latch 130_1 (corresponding to the $1^{st}$ in the connection order) and a second latch 130_N (corresponding to the $N^{th}$ in the connection order). The signal input stage of the first latch 130_1 includes a positive signal input unit and an inverted signal input unit that respectively receives the input signal and the inverted signal of the input signal. The signal output stage of the second latch 130_N includes a positive signal output end and an inverted signal output end that respectively outputs the output signal and the inverted signal of the output signal. The positive signal input unit of the first latch 130_1 is coupled to the inverted signal output end of the second latch 130_N, and the inverted signal input unit of the first latch 130_1 is coupled to the positive signal output end of the second latch 130_N, thereby forming the frequency dividing loop.

Figure 1B:
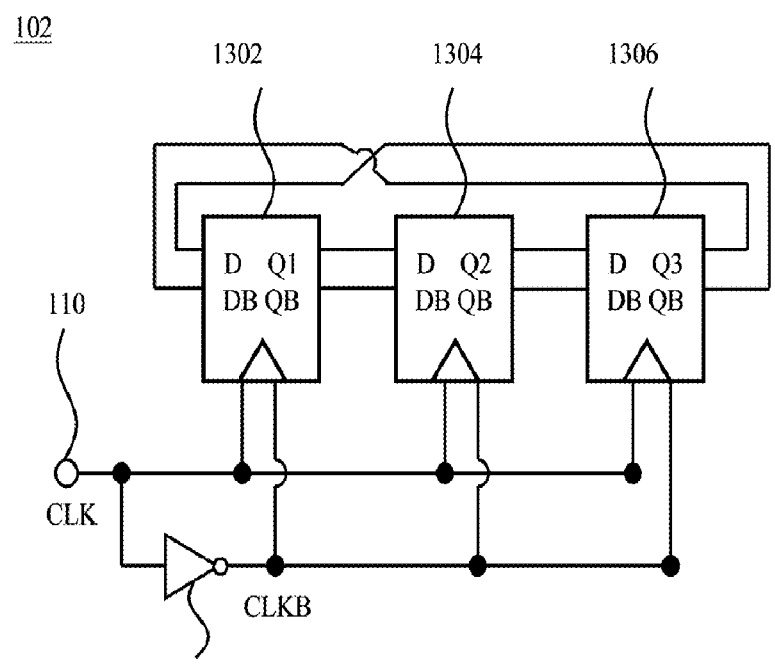
Figure 1C:
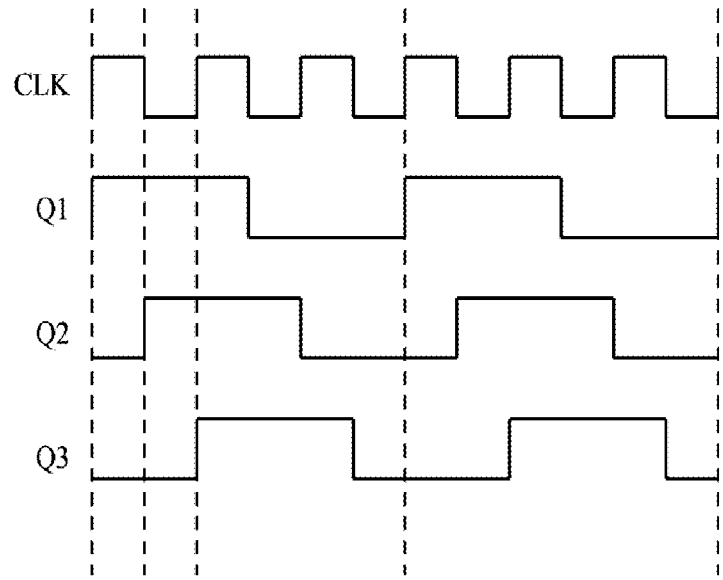
FIG. 1c is a waveform diagram of signals in FIG. 1b.

FIG. 1b shows a schematic diagram of an example of the integer frequency divider 100 in FIG. 1a. FIG. 1c shows a waveform diagram of signals in FIG. 1b. As shown in FIG. 1b, an integer frequency divider 102 includes three latches 1302, 1304 and 1306 for providing a frequency dividing effect of a frequency divisor of 3. At this point, a frequency of an output signal Q1, Q2 or Q3 of the latch 1302, 1304 or 1306 is ⅓ of a frequency of the source clock (CLK). The output signal Q1 of the latch 1302 serves as an input signal to the latch 1304, the output signal Q2 from the latch 1304 serves as an input signal to the latch 1306, and the output signal Q3 from the latch 1306 serves as an input signal to the first latch 1302. Operations of the latches 1302 and the latch 1306 are respectively similar to those of the first latch 130_1 and the second latch 130_N to form a frequency dividing loop. Further, the latch 1302 and the latch 1306 respectively correspond to the $1^{st}$ and the $3^{rd}$ (i.e., corresponding to odd numbers) in a connection order. Thus, the two latches 1302 and 1306 treat the source clock as an input clock and the inverted source clock as an inverted signal of the input clock. The latch 1304 corresponds to the $2^{nd}$ (i.e., corresponding to an even number) in the connection order. Thus, the latch 1304 treats the source clock as an inverted signal of the input clock and the inverted source clock as the input clock, thereby achieving an effect of a 50% duty cycle. Further, in this example, the latches 1302, 1304 and 1306 all correspond to the signal relationship in Table-1 or Table-2. However, the latches 1302 and 1306 corresponding to odd numbers and the latch 1304 corresponding to an even number may respectively correspond to the signal relationships in Table-1 and Table-2. At this point, each of the latches 1302, 1304 and 1306 treats the source clock/inverted source clock as the input clock, and the inverted source clock/source clock as the inverted signal of the input clock.

Figure 2:
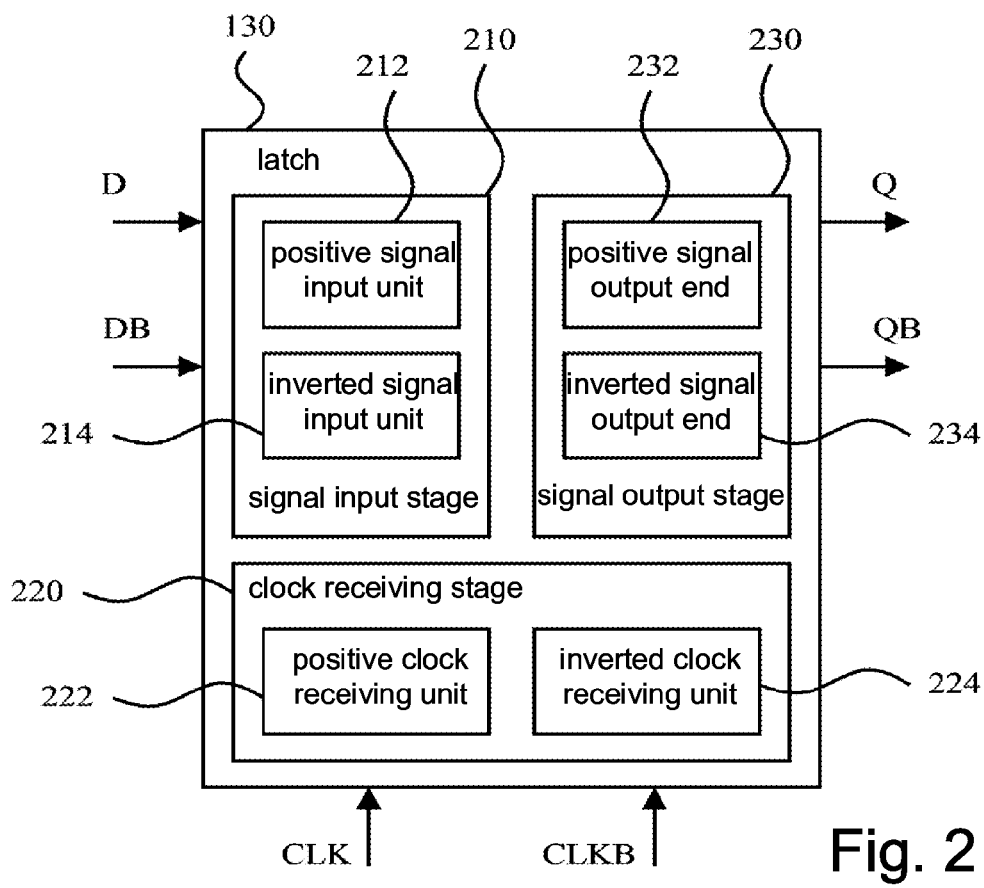
FIG. 2 is a schematic diagram of an architecture of a latch in FIG. 1a according to an embodiment.

To ensure that operations of each of the latches 130 conform to the foregoing first mode, the architecture of the latch 130 of the present invention is as shown in FIG. 2. Referring to FIG. 2, a signal input stage 210 includes a positive signal input unit 212 that receives the input signal, and an inverted signal input unit 214 that receives the inverted signal of the input signal. A clock receiving stage 220 includes a positive clock receiving unit 222 that receives the input clock, and an inverted clock receiving unit 224 that receives the inverted signal of the input clock. More specifically, when the latch 130 corresponds to an odd number in the connection order, the positive clock receiving unit 222 receives the source clock; when the latch 130 corresponds to an even number in the connection order, the positive clock receiving unit 222 receives the inverted source clock. When the positive clock receiving unit 222 receives the source clock/inverted source clock, the inverted clock receiving unit 224 conversely receives the inverted source clock/source clock. The signal output stage 230 includes a positive signal output end 232 that outputs the output signal, and an inverted signal output end 234 that outputs the inverted signal of the output signal.

Figure 3:
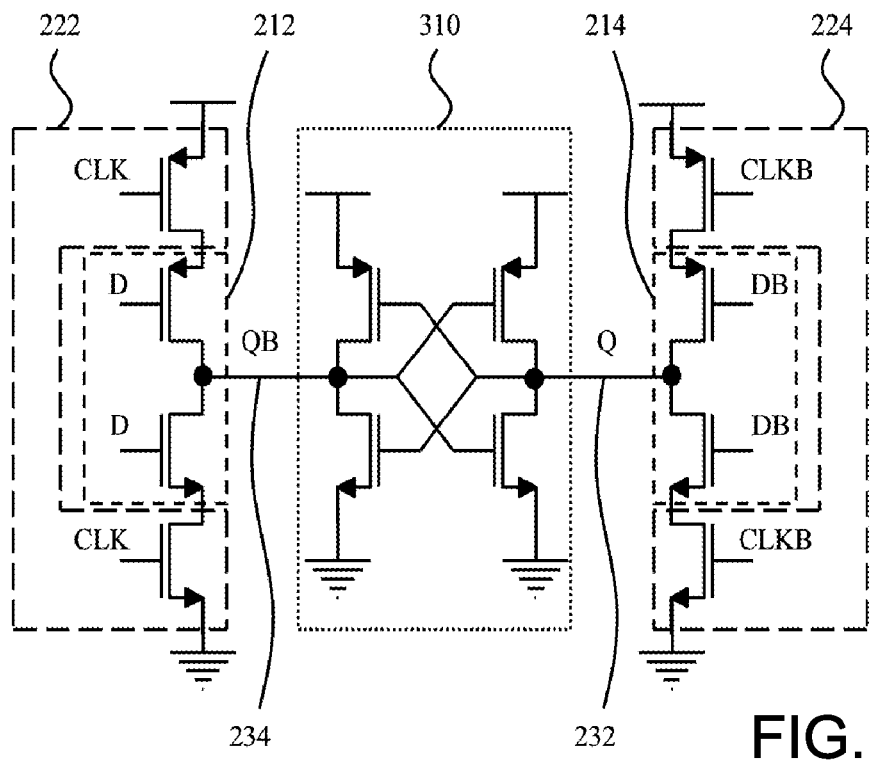
FIG. 3 is a schematic diagram of a latch based on the architecture in FIG. 2 according to an embodiment.

FIG. 3 shows a schematic diagram of an exemplary latch 300 in an application based on the architecture in FIG. 2 according to an embodiment. As shown, in the latch 300 in the embodiment, the positive signal input unit 212 includes a positive input transistor pair, which includes two transistors connected in series for receiving the input signal and for outputting the inverted signal of the output signal via the inverted signal output end 234. The inverted signal input unit 214 includes an inverted input transistor pair, which includes two transistors connected in series for receiving the inverted signal of the input signal and for outputting the output signal via the positive signal output end 232. The positive clock receiving unit 222 includes two positive clock receiving transistors. The two positive clock receiving transistors, coupled between the positive input transistor pair and the first level (e.g., a level "0"), and between the positive input transistor pair and the second level (e.g., a level "1"), respectively, receive the input clock. The inverted clock receiving unit 224 includes two inverted clock receiving transistors. The two inverted clock receiving transistors, coupled between the inverted input transistor pair and the first level, and between the inverted input transistor pair and the second level, respectively, receive the inverted signal of the input clock. The latch 300 further includes a latch unit 310 coupled between the positive signal output end 232 and the inverted signal output end 234. It should be noted that, the latch unit 310 is an optional element. That is, in an alternative embodiment of the present invention, the positive signal input unit 212 in FIG. 3 is directly coupled to the inverted signal input unit 214. Further, in another embodiment of the present invention, functions of the positive signal input unit 212 and the positive clock receiving unit 222 may be exchanged. That is to say, at this point, the positive signal input unit 212 receives the input clock, and the positive clock receiving unit 222 receives the input signal and outputs the inverted signal of the output signal.

Figure 4A:
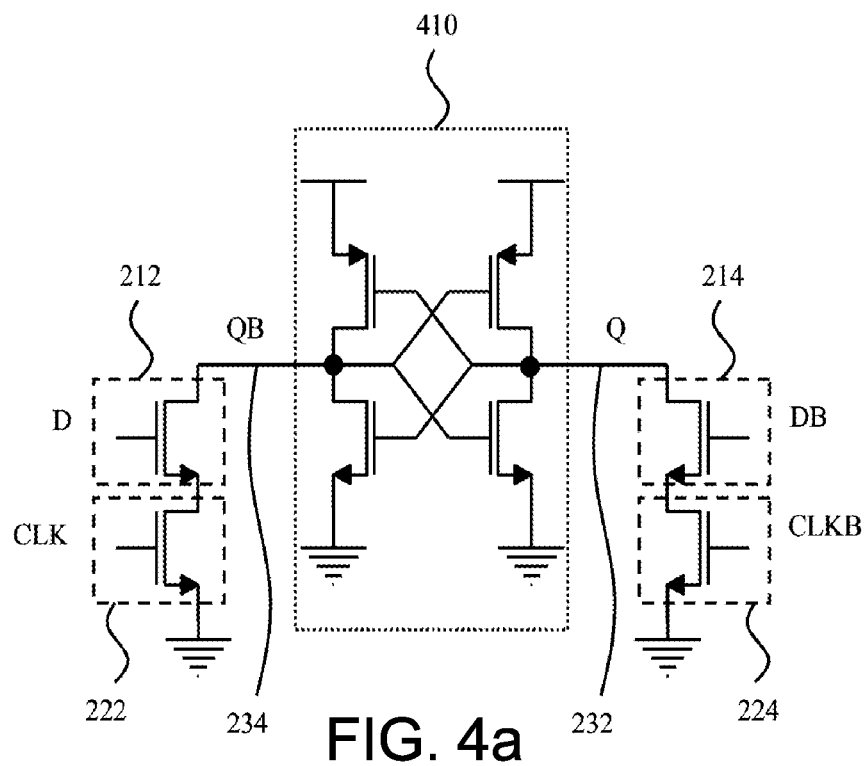
FIG. 4a is a schematic diagram of a latch based on the architecture in FIG. 2 according to another embodiment.
Figure 4B:
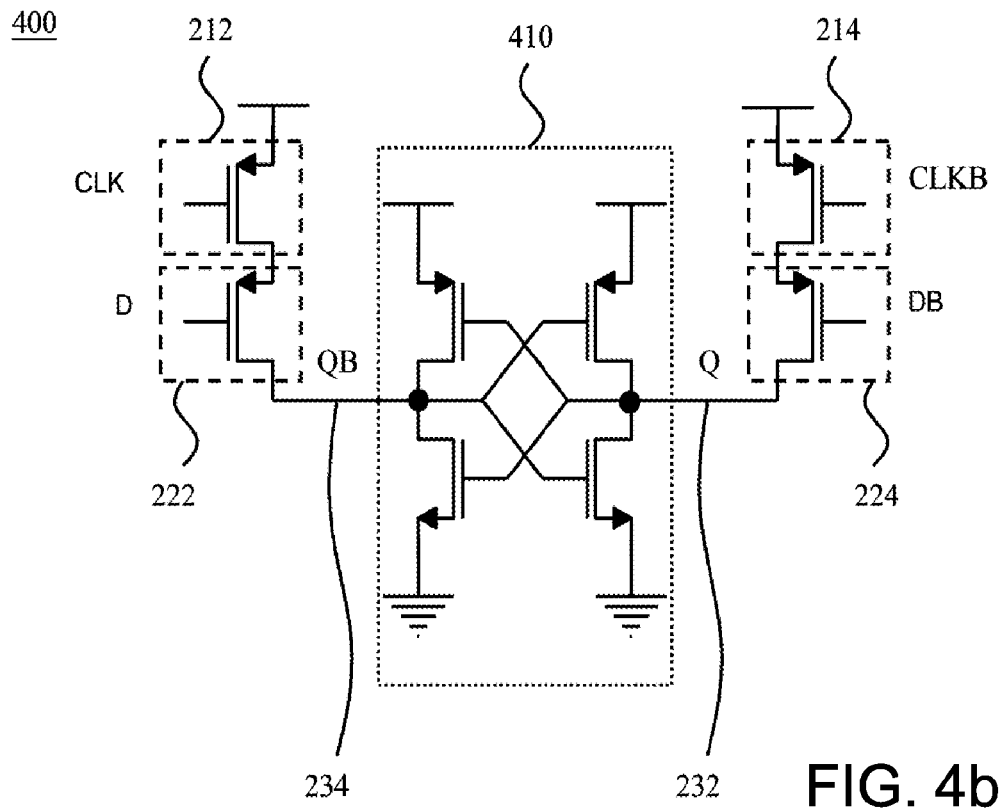

FIG. 4a and FIG. 4b are equivalent circuit diagrams disclosing a latch 400 in an application based on the architecture in FIG. 2 according to another embodiment. As shown, in the latch 400 according to the embodiment, the positive signal input unit 212 includes a positive input transistor, which receives the input signal and outputs inverted signal of the output signal via the inverted signal output end 234. The inverted signal input unit 214 includes an inverted input transistor, which receives the inverted signal of the input signal and outputs the output signal via the positive signal output end 232. The positive clock receiving unit 222 includes a positive clock receiving transistor. The positive clock transistor is coupled between the positive input transistor and the first level or the second level, and receives the input clock. The inverted clock receiving unit 224 includes an inverted clock receiving transistor. The inverted clock receiving transistor is coupled between the inverted input transistor and the first level or the second level, and receives the inverted signal of the input clock. The latch 400 further includes a latch unit 410 coupled between the positive signal output end 232 and the inverted signal output end 234. It should be noted that, similar to the description associated with FIG. 3, in an alternative embodiment, the roles of the positive signal input unit 212 and the positive clock receiving unit 222 in FIG. 4a and FIG. 4b may be exchanged.

Figure 5A:
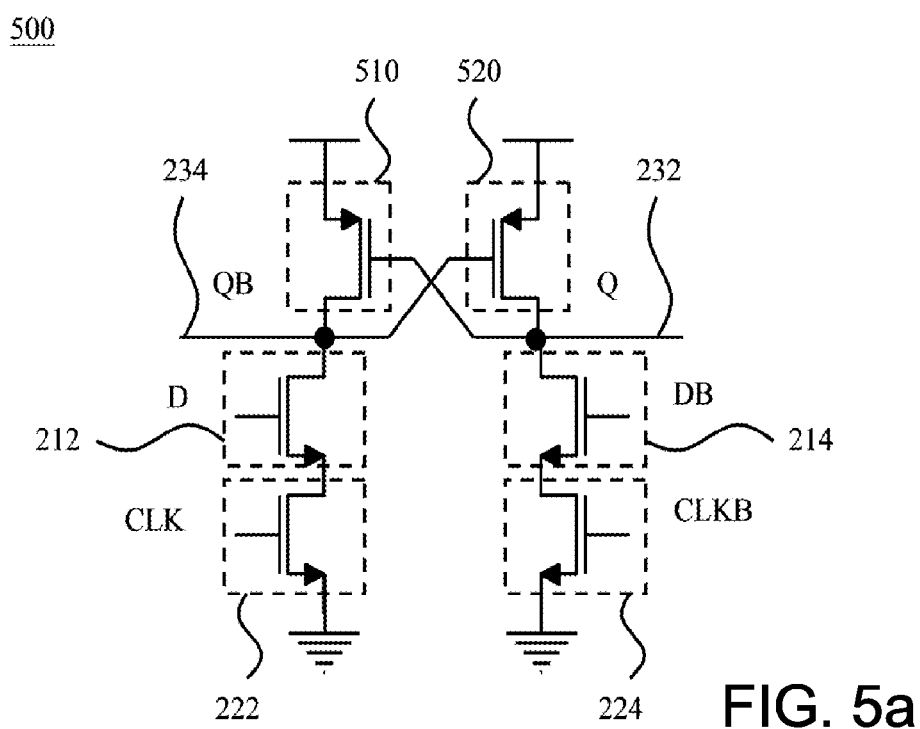
FIG. 5a is a schematic diagram of a latch based on the architecture in FIG. 2 according to another embodiment.
Figure 5B:
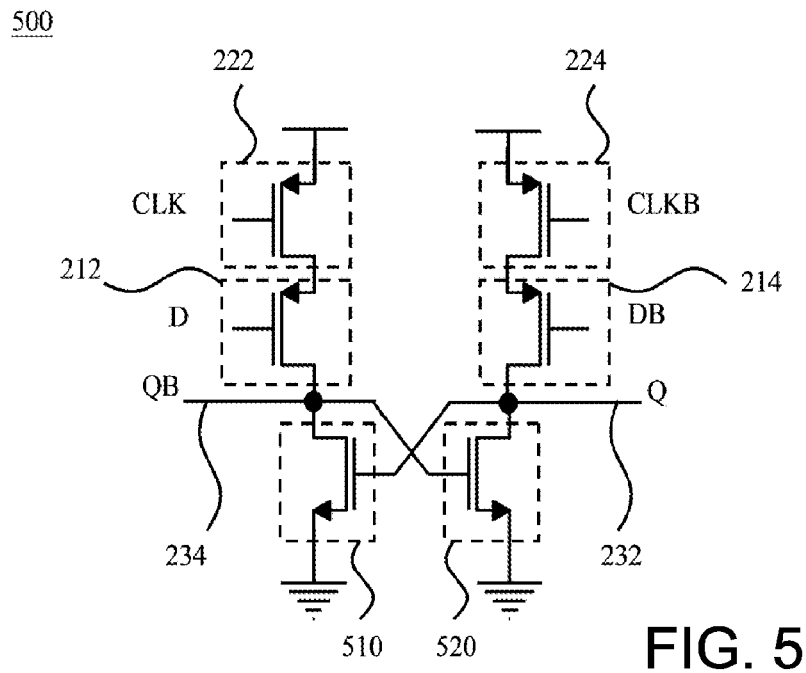

FIG. 5a and FIG. 5b are equivalent circuit diagrams disclosing a latch 500 in an application based on the architecture in FIG. 2 according to another embodiment. As shown, in the latch 500 according to the embodiment, the positive signal input unit 212 includes a positive input transistor, which receives the input signal and outputs the inverted signal of the output signal via the inverted signal output end 234. The inverted signal input unit 214 includes an inverted input transistor, which receives the inverted signal of the input signal and outputs the output signal via the positive signal output end 232. The positive clock receiving unit 222 includes a positive clock receiving transistor. The positive clock receiving transistor is coupled between the positive input transistor and the first level or the second level, and receives the input clock. The inverted clock receiving unit 224 includes an inverted clock receiving transistor. The inverted clock receiving transistor is coupled between the inverted input transistor and the first level or the second level, and receives the inverted signal of the input clock. In the embodiment, the latch 500 further includes a first transistor 510 and a second transistor 520. The first transistor 510 is coupled between the second level or the first level and the inverted signal output end 234, and is turned on or turned off according to the output signal. The second transistor 520 is coupled between the second level or the first level and the positive signal input end 232, and is turned on or turned off according to the inverted signal of the output signal. It should be noted that, similar to the description associated with FIG. 3, in another embodiment of the present invention, functions of the positive signal input unit 212 and the positive clock receiving unit 222 in FIG. 5a and FIG. 5b may be exchanged.

It should be noted that, the latches 300, 400 and 500 described in the foregoing embodiments are examples for explaining the present invention. Provided that the architecture of the latch 130 or other equivalent architectures are fulfilled, other embodiments are considered within the scope of the present invention. The N latches 130 in FIG. 1a may be implemented by latches of the same form or different forms to compose the integer frequency divider 100. Further, the transistors from FIG. 3 to FIG. 5 include NMOS transistors and PMOS transistors. Drawings and operations of these transistors are known to one person skilled in the art, and shall be omitted herein.

Figure 6:
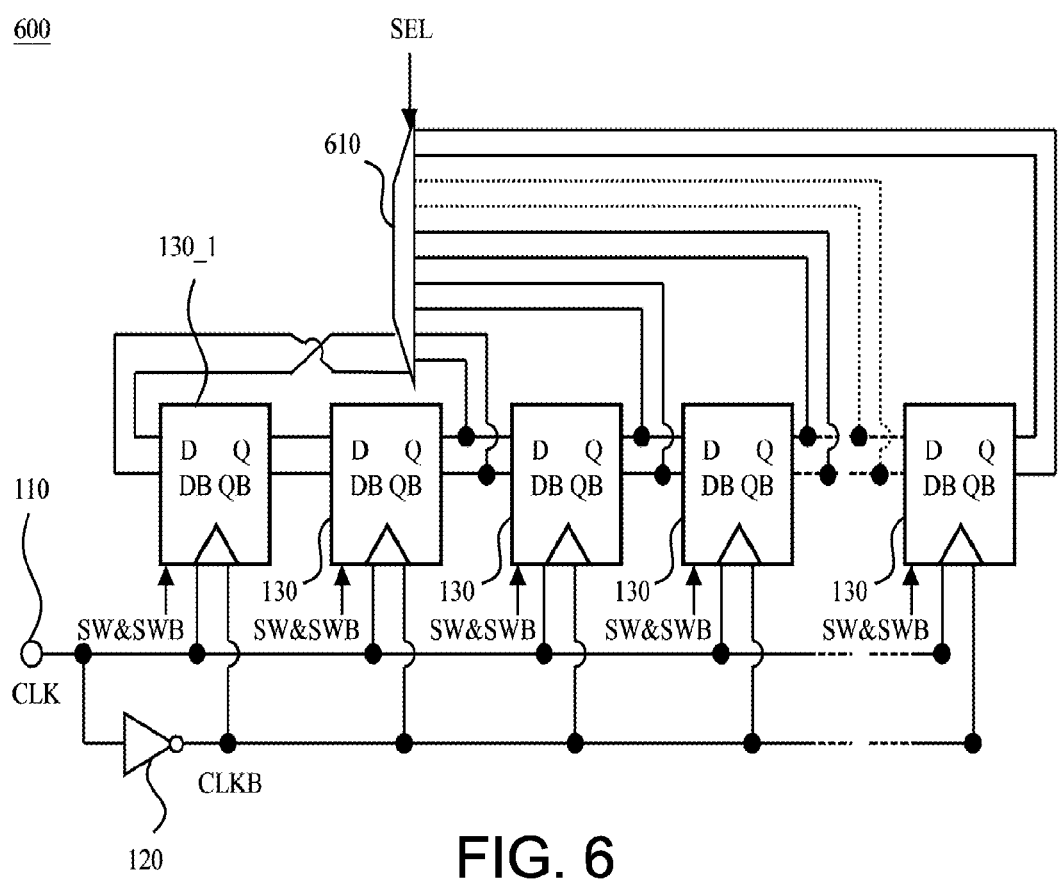
FIG. 6 is a schematic diagram of a programmable integer frequency divider according to an embodiment of the present invention.

Referring to FIG. 6, to enhance utilization flexibilities of the integer frequency divider of the present invention, the integer frequency divider 100 in FIG. 1a may form a programmable integer frequency divider 600 in FIG. 6 though appropriate designs. As shown in FIG. 6, the programmable integer frequency divider 600 regards all other latches 130 as candidate latches except the first latch 130_1, and includes a selection circuit 610 (e.g., a multiplexer). The selection circuit 610 is coupled to the signal output stage of each of the candidate latches, and selects one (e.g., the M$^{th}$ latch in the arrangement order) of the candidate latches as the second latch 130_N (the second latch 130_N in the embodiment is not necessarily the N$^{th}$ latch in the arrangement order) according to a selection signal (SEL) to form a frequency dividing loop. In other words, the programmable integer frequency divider 600 forms the required frequency dividing loop through the selection circuit 610, such that the frequency dividing loop includes M latches 130 for frequency dividing operations according to requirements of the frequency dividing loop, where M is a positive integer and 2≤M≤N.

Figure 7:
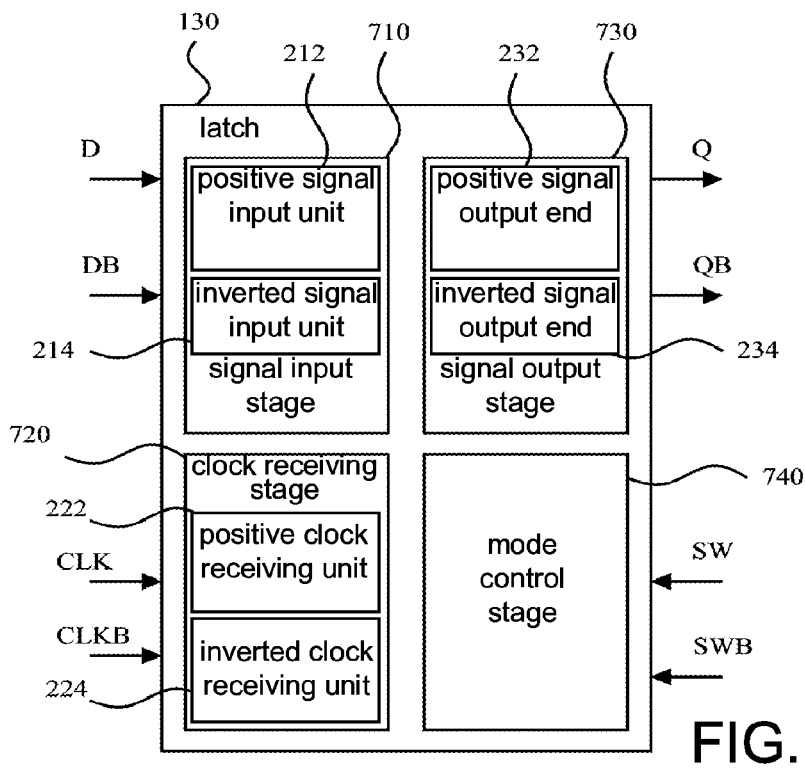
FIG. 7 is a schematic diagram of an architecture of a latch in FIG. 6 according to an embodiment.

To enable to the programmable integer frequency divider 600 to achieve a 50% duty cycle in both situations where M is an odd number and M is an even number, the latch 130 in FIG. 6 further supports a second mode in addition to the above-mentioned first mode. More specifically, as shown in FIG. 7, besides a signal input stage 710, a clock receiving stage 720 and a signal output stage 730 similar or equal to the corresponding elements in FIG. 2, the architecture of each of the latches 130 further includes a mode control stage 740 that receives a mode control signal (SW). The mode control signal prompts the operations of the latch 130 to correspond to the first mode (e.g., when SW=0) or the second mode (e.g., when SW=1). The first mode indicates that an odd number of latches 130 from the latches 130 form the frequency dividing loop, and the first latch 130_1 and the second latch 130_N at this point correspond to the odd number or even number in the connection order at the same time. The second mode indicates that an even number of latches 130 from the latches 130 form the frequency dividing loop, and the first latch 130_1 and the second latch 130_N respectively correspond to an odd number and an even number in the connection order. The signal relationship under the first mode as shown in Table-1 and Table-2 above. The signal relationship under the second mode is as shown in Table-4 below. In Table-4, "0" represents a first level, and "1" represents a second level. It should be noted that, as previously stated, for any of the latches, when definitions of the source clock and the inverted source clock are exchanged, the signal corresponding relationship under the second mode in Table-4 is replaced by Table-5 below. Further, a value of the mode control signal may be determined according to the selection signal. That is to say, whether the number M of latches forming the frequency dividing loop is an odd number or an even number may be learned through the selection signal, and may thus be utilized to determine the value of the mode control signal.

TABLE 4

| Input signal D | Source clock CLK | Output signal Q |
| --- | --- | --- |
| 0 | 0 | Unchanged |
| 0 | 1 | 0 |
| 1 | 0 | Unchanged |
| 1 | 1 | 1 |

TABLE 5

| Input signal D | Source clock CLK | Output signal Q |
| --- | --- | --- |
| 0 | 0 | 0 |
| 0 | 1 | Unchanged |
| 1 | 0 | 1 |
| 1 | 1 | Unchanged |

Figure 8:
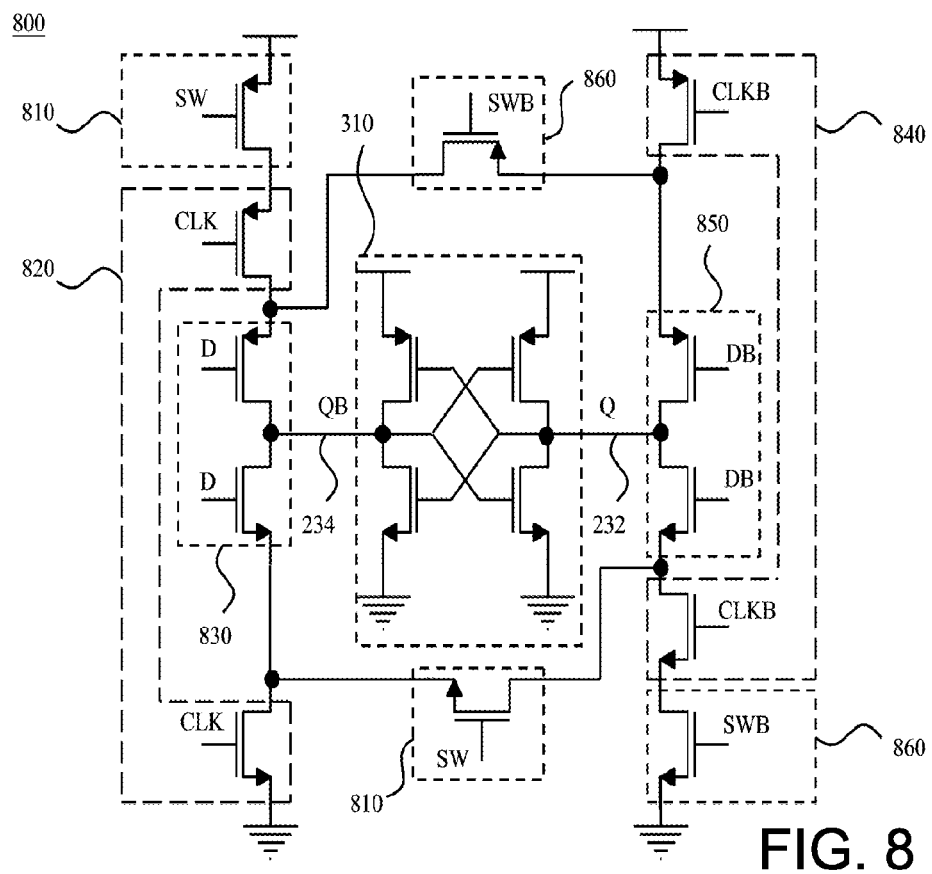
FIG. 8 is a schematic diagram of a latch based on the architecture in FIG. 7 according to an embodiment.

FIG. 8 is a schematic diagram of a latch 800 based on the architecture in FIG. 7 according to an embodiment. As shown, the latch 800 according to the embodiment is similar to the latch 300. Main differences of the latch 800 from the latch 300 are that, the latch 800 further includes two positive switching transistors 810 and two inverted switching transistors 860. The positive switching transistors 810 are turned on or turned off according to a mode control signal. One of the positive switching transistors 810 is coupled between a positive clock input unit 820 and the second level, and the other of the positive switching transistors 810 has one end coupled between the positive clock input unit 820 and a positive signal input unit 830 and the other end coupled between an inverted clock input unit 840 and an inverted signal input unit 850. The two inverted switching transistors 860 are turned on or turned off according to an inverted signal (SWB) of the mode control signal. One of the inverted switching transistors 860 has one end coupled between the positive clock input unit 820 and the positive signal input unit 830 and the other end coupled between the inverted clock input unit 840 and the inverted signal input unit 850, and the other of the inverted switching transistors 860 is coupled between the inverted clock input unit 840 and the first level.

Figure 9A:
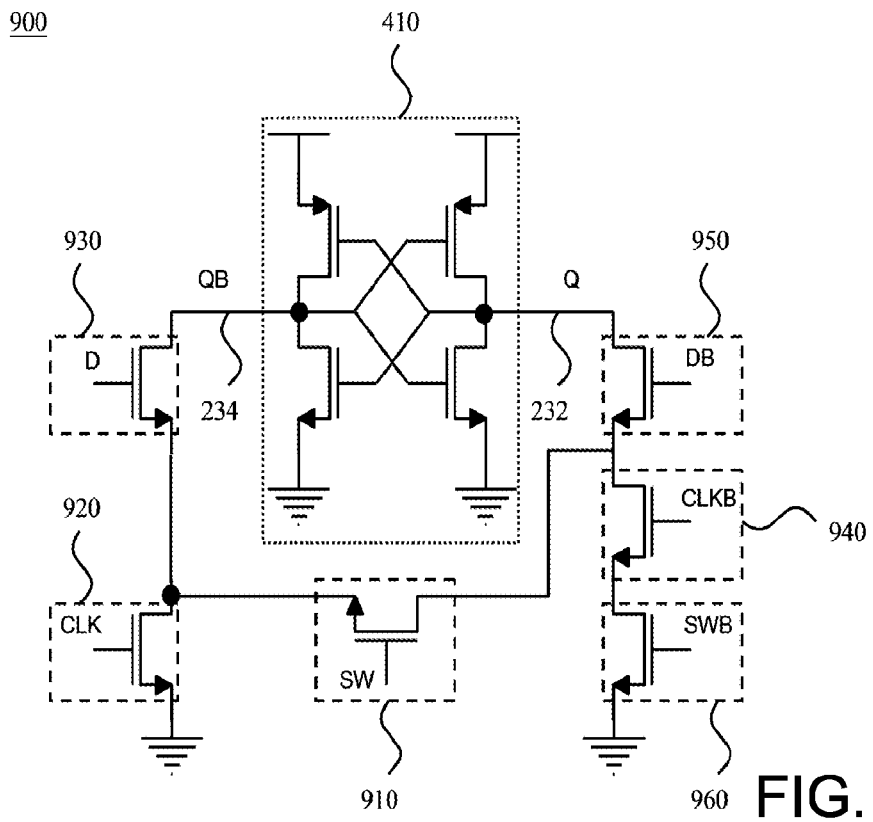
FIG. 9a is a schematic diagram of a latch based on the architecture in FIG. 7 according to another embodiment.
Figure 9B:
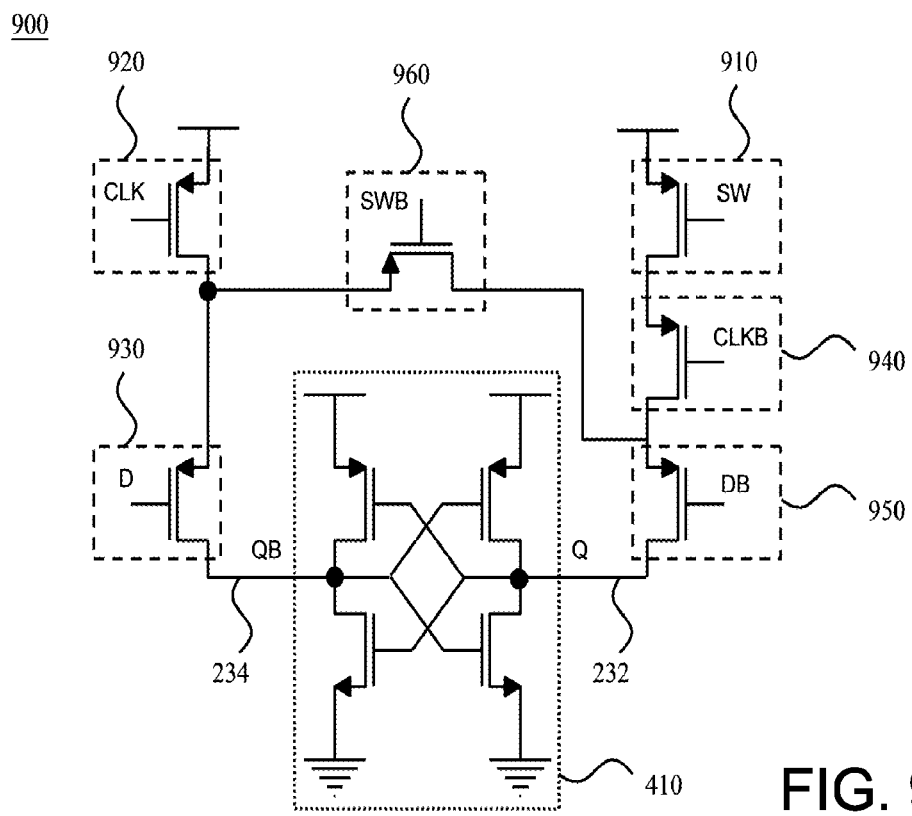

FIG. 9a and FIG. 9b are equivalent circuit diagrams disclosing a latch 900 based on the architecture in FIG. 7 according to another embodiment of the present invention. As shown, the latch 900 according to this embodiment is similar to the latch 400. Main differences of the latch 900 from the latch 400 are that, the latch 900 further includes a positive switching transistor 910 and an inverted switching transistor 960. The positive switching transistor 910 is turned on or turned off according to the control mode signal, and has one end coupled between a positive clock input unit 920 and a positive signal input unit 930 (FIG. 9a) or coupled to the second level (FIG. 9b), and the other end coupled between an inverted clock input unit 940 and an inverted signal input unit 950 (FIG. 9a) or coupled to the inverted clock input unit 940 (FIG. 9b). The inverted switching transistor 960 is turned on or turned off according to the inverted signal of the mode control signal, and has one end coupled to the inverted clock input unit 940 (FIG. 9a) or coupled between the positive clock input unit 920 and the positive signal input unit 930 (FIG. 9b), and the other end coupled to the first level (FIG. 9a) or coupled between the inverted clock input unit 940 and the inverted signal input unit 950 (FIG. 9b).

Figure 10:
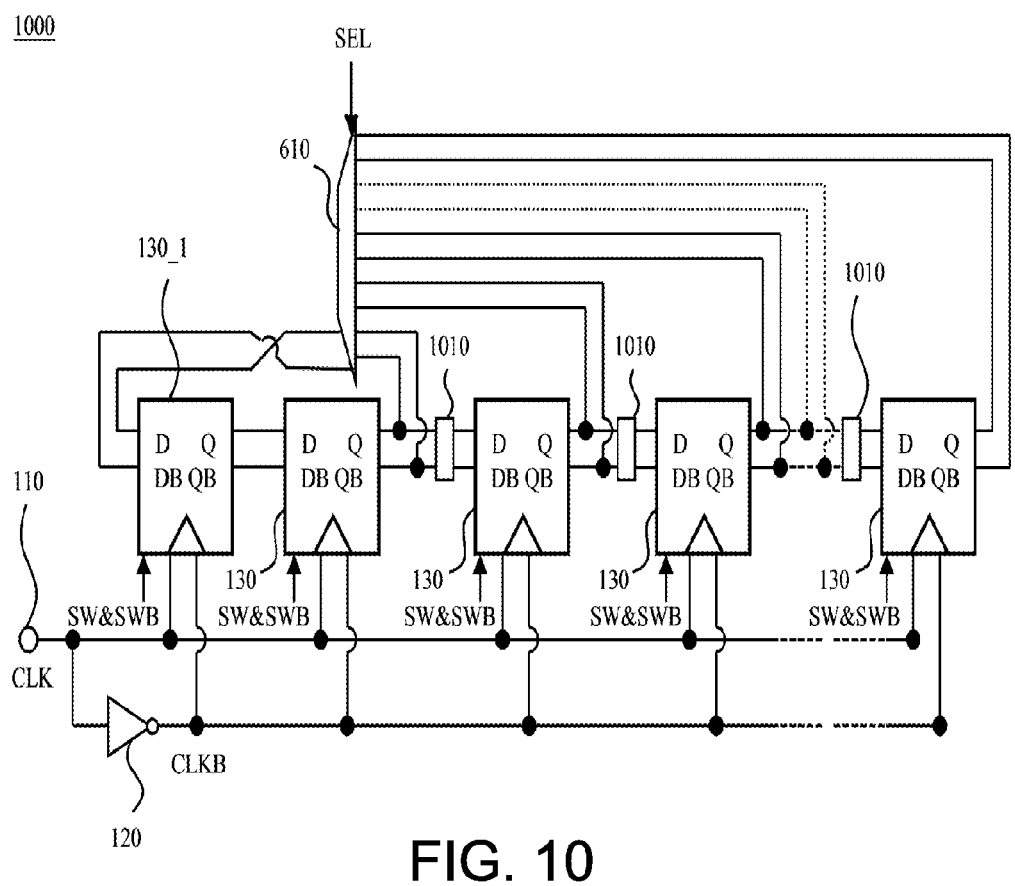
FIG. 10 is a schematic diagram of a programmable integer frequency divider according to another embodiment of the present invention.

FIG. 10 shows a schematic diagram of a programmable integer frequency divider according to another embodiment of the present invention. As shown, in addition to the elements shown in FIG. 6, a programmable integer frequency divider 1000 further includes a switch 1010 disposed between two adjacent candidate latches. The switch 1010 terminates operations of the candidate latches subsequent to the second latch 130_N to prevent unnecessary power consumption. The candidate latches refer to the latches 130 other than the first latch 130_1. More specifically, assuming that a front stage and a back stage of two adjacent candidate latches are a first candidate latch and a second candidate latch, the switch 1010 is connected between the signal output stage of the first candidate latch and the signal input stage of the second candidate latch. When the first candidate latch serves as the second latch 130_N or the back stage of the second latch 130N, i.e., when the second candidate latch is not used in forming the frequency dividing loop, the switch 1010 disconnects the connection between the first and second candidate latches, and couples the signal of the second candidate latch to a reference voltage value (e.g., a ground voltage) or keeps the signal of the second candidate latch floating to terminate operations of the second candidate latch, thereby reducing power consumption. One person skilled in the art may realize the control on the switch based on the above disclosure, e.g., determining whether the switches 1010 are turned on or turned off according to the abovementioned selection signal. Without affecting the full disclosure and possible implementation of the application, such details are omitted herein.

In conclusion, without involving an additional control/trimming circuit or control signal θ, the integer frequency divider and the programmable integer frequency divider of the present invention are capable of achieving a 50% duty cycle as well as supporting frequency dividing operations of divisors in both odd and even numbers. Further, by adding a switch, the integer frequency divider and the programmable integer frequency divider of the present invention achieve a power-saving effect. In other words, compared to the prior art, the present invention offers a simple and easily controlled circuit with lower costs, a faster operation speed and less power consumption.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integer frequency divider, comprising:
    a clock input end, configured to provide a clock;
    N latches, where N is a positive integer greater than or equal to 2, the latches connected in series according to a connection order, the latches comprising a first latch and a plurality of candidate latches, each of the latches comprising:
        a signal input stage, configured to receive an input signal;
        a clock receiving stage, configured to receive an input clock; the clock receiving stage of the latch treating the clock as the input clock when the latch corresponds to an odd number in the connection order; the clock receiving stage of the latch treating an inverted clock of the clock as the input clock when the latch corresponds to an even number in the connection order; and
        a signal output stage, configured to output an output signal according to the input signal and the input clock;
    a selection circuit, coupled to the signal output stages of each of the candidate latches, configured to select a second latch from the candidate latches according to a selection signal;
    wherein:
    the signal input stage of the first latch comprises a positive signal input unit and an inverted signal input unit that respectively receive the input signal and an inverted signal of the input signal; the signal output stage of the second latch comprises a positive signal output end and an inverted signal output end that respectively output the output signal and an inverted signal of the output signal; and
    the selection circuit couples the positive signal input unit of the first latch to the inverted signal output end of the second latch, and couples the inverted signal input unit of the first latch to the positive signal output end of the second latch.

2. The integer frequency divider according to claim 1, wherein when N is the odd number, if the input signal corresponds to a first level and the input clock corresponds to the first level, the output signal corresponds to the first level; if the input signal corresponds to the first level and the input clock corresponds to a second level, the output signal remains unchanged; if the input signal corresponds to the second level and the input clock corresponds to the first level, the output signal remains unchanged; if the input signal corresponds to the second level and the input clock corresponds to the second level, the output signal corresponds to the second level.

3. The integer frequency divider according to claim 1, wherein the latches comprise a first latch and a second latch; the signal input stage of the first latch comprises a positive signal input unit and an inverted signal input unit that respectively receive the input signal and an inverted signal of the input signal; the signal output stage of the second latch comprises a positive signal output end and an inverted signal output end that respectively output the output signal and an inverted signal of the output signal; the positive signal input unit is coupled to the inverted signal output end, and the inverted signal input unit is coupled to the positive signal output end.

4. The integer frequency divider according to claim 1, wherein the positive signal input unit is coupled to the inverted signal output end, and the inverted signal input unit is coupled to the positive signal output end.

5. The integer frequency divider according to claim 4, the candidate latches comprising a first candidate latch and a second candidate latch, the integer frequency divider further comprising:
    a switch, disposed between the signal output stage of the first candidate latch and the signal input stage of the second candidate latch; when the selection circuit selects the first candidate latch as the second latch, the switch coupling the signal input stage of the second candidate latch to a reference voltage value or keeping the signal input stage of the second candidate latch floating to terminate operations of the second latch.

6. The integer frequency divider according to claim 1, wherein each of the latches further comprises:
    a mode control stage, configured to receive a mode control signal that renders operations of the latch to correspond to a first mode or a second mode; the first mode indicates that an odd number of the latches form a frequency dividing loop, and the second mode indicates that an even number of the latches form the frequency dividing loop.

7. The integer frequency divider according to claim 6, wherein when the operations of the latches correspond to the second mode, if the input signal corresponds to the first level and the clock corresponds to the first level, the output signal remains unchanged; if the input signal corresponds to the first level and the clock corresponds to the second level, the output signal corresponds to the first level; if the input signal corresponds to the second level and the clock corresponds to the first level, the output signal remains unchanged; if the input signal corresponds to the second level and the clock corresponds to the second level, the output signal corresponds to the second level.

8. The integer frequency divider according to claim 1, wherein for each of the latches,
    the signal input stage comprises:
        a positive signal input unit, configured to receive the input signal; and
        an inverted signal input unit, configured to receive an inverted signal of the input signal;
    the clock receiving stage comprises:
        a positive clock receiving unit, configured to receive the input clock; and an inverted clock receiving unit, configured to receive an inverted signal of the input clock; and the signal output stage comprises:

a positive signal output end, configured to output the output signal; and an inverted signal output end, configured to output an inverted signal of the output signal.

9. The integer frequency divider according to claim 8, wherein at least one of the latches further comprises:

a latch unit, coupled between the positive signal output end and the inverted signal output end.

10. The integer frequency divider according to claim 9, wherein for the latch comprising the latch unit, the positive signal input unit comprises:

a positive input transistor pair, comprising two transistors connected in series, configured to receive the input signal and to output the inverted signal of the output signal via the inverted signal output end;

the inverted signal input unit comprises:

an inverted input transistor pair, comprising two transistors connected in series, configured to receive the inverted signal of the input signal and to output the output signal via the positive signal output end;

the positive clock receiving unit comprises:

two positive clock receiving transistors, respectively coupled between the positive input transistor pair and the first level and between the positive input transistor pair and the second level, configured to receive the input clock; and the inverted clock receiving unit comprises:

two inverted clock receiving transistors, respectively coupled between the inverted input transistor pair and the first level and between the inverted input transistor pair and the second level, configured to receive the inverted signal of the input clock.

11. The integer frequency divider according to claim 9, wherein for the latch comprising the latch unit, the positive signal input unit comprises:

a positive input transistor, configured to receive the input signal and to output the inverted signal of the output signal via the inverted signal output end;

the inverted signal input unit comprises:

an inverted input transistor, configured to receive the inverted signal of the input signal and to output the output signal via the positive signal output end;

the positive clock receiving unit comprises:

a positive clock receiving transistor, coupled between the positive input transistor and the first level or the second level, configured to receive the input clock; and the inverted clock receiving unit comprises:

an inverted clock receiving transistor, coupled between the inverted input transistor and the first level or the second level, configured to receive the inverted signal of the input clock.

12. The integer frequency divider according to claim 8, wherein for the latch that does not comprise the latch unit, the positive signal input unit comprises:

a positive input transistor, configured to receive the input signal and to output the inverted signal of the output signal via the inverted signal output end;

the inverted signal input unit comprises:

an inverted input transistor, configured to receive the inverted signal of the input signal and to output the output signal via the positive signal output end;

the positive clock receiving unit comprises:

a positive clock receiving transistor, coupled between the positive input transistor and the first level or the second level, configured to receive the input clock;

the inverted clock receiving unit comprises:

an inverted clock receiving transistor, coupled between the inverted input transistor and the first level or the second level, configured to receive the inverted signal of the input clock; and the latch further comprises:

a first transistor, coupled between the second level or the first level and the inverted signal output end, configured to be turned on or turned off according to the output signal; and a second transistor, coupled between the second level or the first level and the positive signal output end, configured to be turned on or turned off according to the inverted signal of the output signal.

13. The integer frequency divider according to claim 1, being an integer frequency divider capable of achieving a 50% duty cycle.

* * * * *